United States Patent
Ozawa

(10) Patent No.: US 6,730,925 B1
(45) Date of Patent: May 4, 2004

(54) METHOD AND APPARATUS FOR PROJECTION EXPOSURE AND DEVICE MANUFACTURING METHOD

(75) Inventor: Ken Ozawa, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 259 days.

(21) Appl. No.: 09/711,944

(22) Filed: Nov. 15, 2000

(30) Foreign Application Priority Data

Nov. 16, 1999 (JP) ............................................ 11-326192

(51) Int. Cl.[7] ............................................. G01N 21/86
(52) U.S. Cl. ...................... 250/548; 250/559.3; 355/53
(58) Field of Search ............................... 250/548, 559.3, 250/559.12, 559.22; 355/43, 44, 45, 68, 53, 67, 71, 69

(56) References Cited

U.S. PATENT DOCUMENTS

| | | | |
|---|---|---|---|
| 5,473,412 A | 12/1995 | Ozawa | ........................ 355/77 |
| 5,526,093 A | 6/1996 | Takahashi | |
| 5,627,627 A | 5/1997 | Suzuki | |
| 5,728,495 A | 3/1998 | Ozawa | ........................ 430/30 |
| 5,965,308 A | 10/1999 | Ozawa | ........................ 430/30 |
| 6,124,064 A | 9/2000 | Ozawa | |
| 6,501,535 B1 | 12/2002 | Ozawa | ........................ 355/68 |

FOREIGN PATENT DOCUMENTS

| | | |
|---|---|---|
| JP | A 6-252022 | 9/1994 |
| JP | 10-064801 | 3/1998 |
| JP | 10-135099 | 5/1998 |

*Primary Examiner*—David V. Bruce
*Assistant Examiner*—Hoon Song
(74) *Attorney, Agent, or Firm*—Oliff & Berridge, PLC

(57) ABSTRACT

An exposure method is provided so that the dividend regions defined on a wafer are successively exposed using pulses of laser light emitted from an excimer laser light source in such a way that each region receives a different level of target exposure levels. And, transmittance of a course energy adjuster, having a number of neutral density filters, is adjusted so that a sub-divided region receiving the least number of exposure pulses can receive a pulse count that exceeds the minimum number of exposure pulses required for optimal exposure. During the process of scanning exposure, transmittance of the coarse energy adjuster is held constant so that, to compensate for variations in the pulse energy, the output power of the excimer laser light source is adjusted according to real-time data output from an integrator sensor.

19 Claims, 8 Drawing Sheets

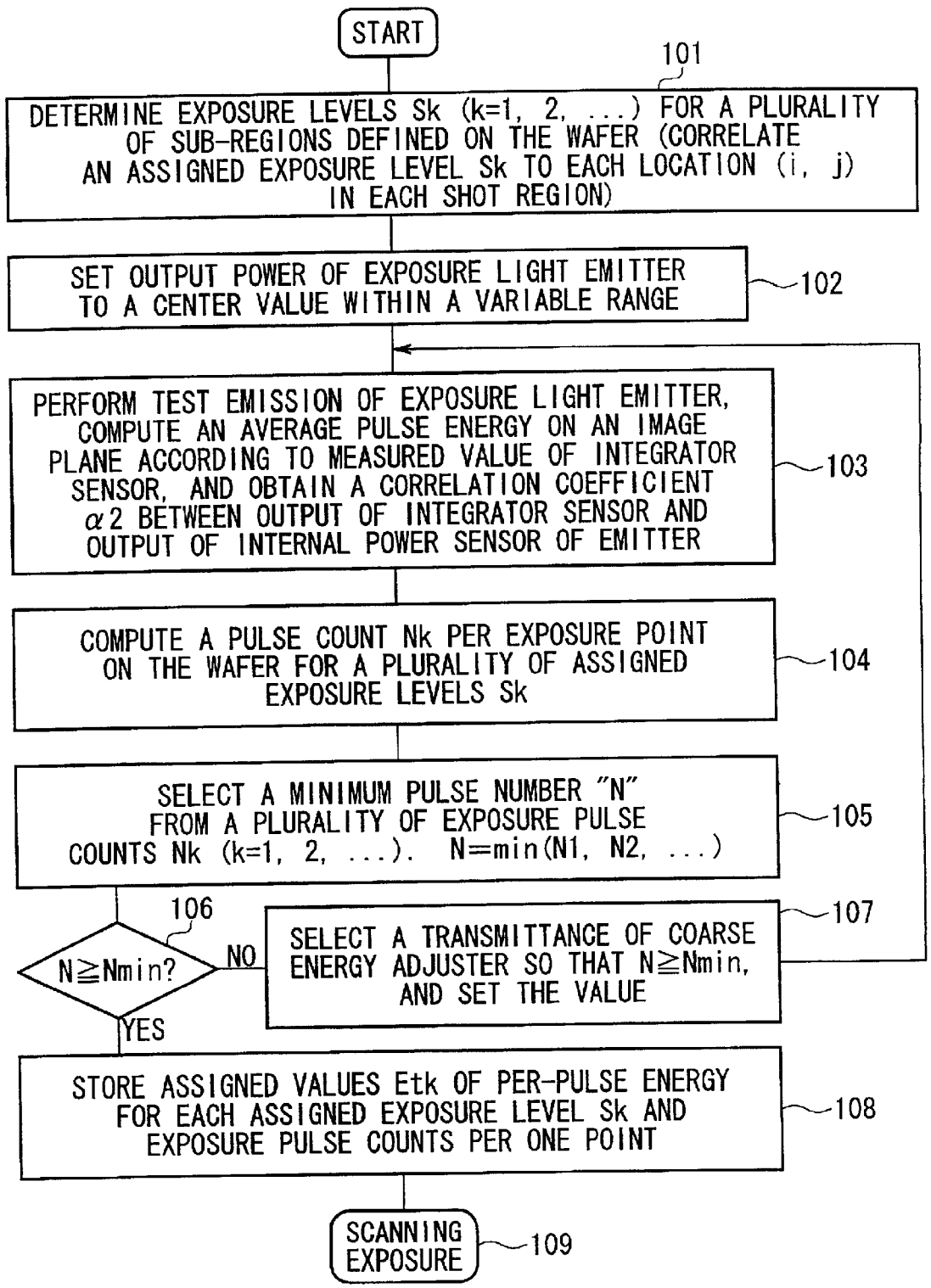

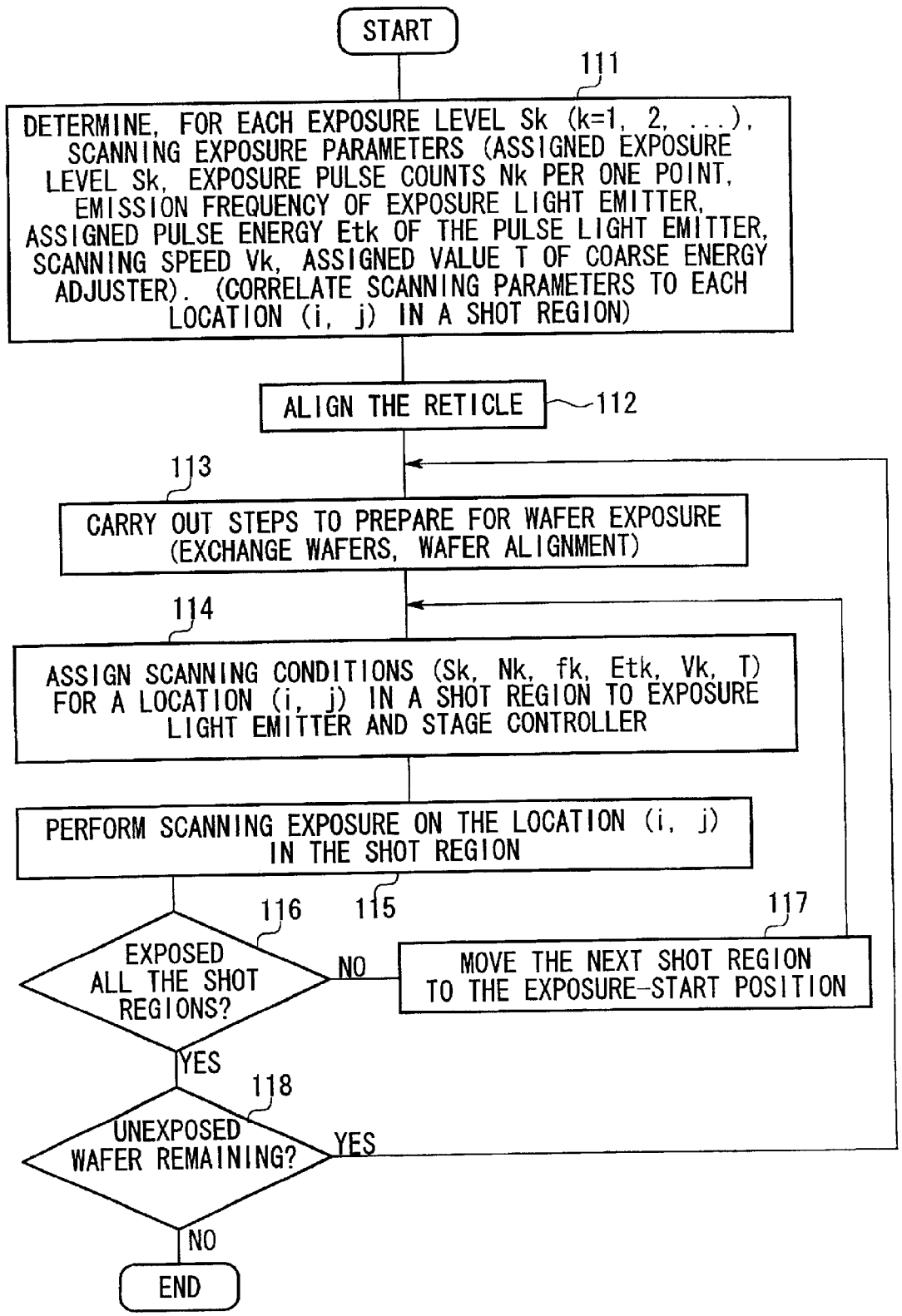

METHOD AND APPARATUS FOR PROJECTION EXPOSURE AND DEVICE MANUFACTURING METHOD

BACKGROUND OF THE INVENTION

1. Field of the Invention

The present invention relates to an exposure method and an exposure apparatus used in photolithographic processes for manufacturing of semiconductor device elements, image pickup elements (CCD), liquid crystal display elements, plasma display elements and thin film magnetic heads. The method is particularly suitable for controlling light exposure of an exposure beam from a pulse light source used in scanning type projection exposure apparatus based on the step-and-scan method. This invention is based on a Japanese Patent Application, First Publication, Hei 11-326192, the content of which is incorporated herein by reference.

2. Description of the Related Art

One of the basic functions of the projection exposure apparatus for manufacturing of semiconductor device elements, for example, is to control the integrated exposure level on the object to be exposed within a suitable range, at each point in each shot region of a wafer (or glass plate) that has been coated with a photoresist coating (photo-sensitive material). Conventionally, regardless of whether a continuous light source such as mercury lamp or a pulsed light source such as excimer laser light source is used to expose the wafer, exposure control for a static exposure type apparatus such as the conventional stepper is based on the so-called "cutoff control", in which the exposure is continued until the integrated exposure on the wafer measured indirectly by the detector, comprised by an integrator sensor disposed in the illumination optical system, exceeds a specific exposure value (target exposure level) corresponding to a critical level.

When the exposure light source emits pulses of laser light, because individual pulses have different levels of light energy, it has been a practice to assure reproducibility of precision in exposure control by applying more than a certain minimum number of exposure pulses. In such a case, because the minimum exposure energy level is low for a high sensitivity photoresist material, it is necessary to place a light reducing member in the optical path to reduce the power of the laser pulses uniformly so as to assure delivery of pulses exceeding the minimum number of exposure pulses.

Further, for scanning exposure type apparatus based on the step-and-scan method, which has been in use in recent years, a conventional method (open-level exposure control method) is used, in which the exposure light (exposure beam) containing pulses of laser light is simply accumulated by integrating the light energy. In such a method, it is necessary to adjust the pulse energy so that a linear control can be applied to obtain a desired degree of exposure control as computed from the following relation. In other words, the pulses must be counted in whole numbers.

(target exposure level)=(number of pulses)×(average energy per pulse)

where a value for the average energy per pulse is to be obtained by the integrator sensor immediately prior to an exposure event.

In contrast, as disclosed in a recent Japanese Patent Application, First Publication, Hei 6-252022 and in a corresponding U.S. Pat. No. 5,627,627, the pulse energy of individual pulses is controlled by determining the values of individual pulse energy in real-time during the exposure process so that an integrated energy level of prior pulses can be used to determine a target value for the pulse energy of a next group of pulses. This per-pulse exposure level control method enables to minimize the scatter in the integrated exposure levels compared with the open-level exposure control method.

As outlined above, although there have been proposals for various types of exposure level control method, when it is necessary to change the exposure level over a relatively wide range of transmittance, all of these methods require the use of a specific light reducing member to lower the power of the exposure light (either pulsed or continuous). In such a process, it is necessary to mechanically switch the optical filters having different light transmittance characteristics in the light reducing member, and, immediately after changing the transmittance, to perform test emission of light source to measure the power (exposure energy) of the exposure light transmitted through the filter, and to re-adjust the exposure conditions to be consistent with the measured values of the existing power (exposure pulses per one point on the wafer if the exposure light consists of pulses).

It should be noted that, deviations in the line widths of the circuit patterns formed on the wafer are caused by variations in the thickness of the coating applied on the wafer in the course of applying the photoresist coating, and by a related phenomenon of non-uniformity of standing waves within the photoresist coating, as well as non-uniformity in developing the patterns. Such errors in line widths cause errors in the line widths of the circuit patterns on each layer of integrated circuit fabricated on the wafer. Therefore, as the density of circuit integration of semiconductor devices increases further, there is a danger of lower yield of final product caused by such errors in the line width. To correct such line widths errors in the photoresist pattern, it is necessary to conduct a series of test exposures. For example, several evaluation wafers are prepared by applying a photoresist coating and performing test printing by varying the integrated exposure level over the coated wafer by a given amount. After developing the photoresist pattern, line widths of resist patterns in each shot region are measured so that the exposure level that produced a line width nearest to the design value can be chosen as the correct exposure level for that shot region. The distribution of target exposure level thus obtained is roughly concentric about the center of the wafer, for example, so that it is considered practical to divide the entire shot region into a number of sub-regions and to determine a proper exposure level for a group of sub-regions. Also, it may be considered that the variation in the target exposure level in various sub-regions is about ±10% with respect to the average value of the exposure level.

Therefore, when different exposure levels are assigned to a plurality of sub-regions in the wafer, use of the conventional light reducing member leads to the necessity of performing exposure testing whenever the exposure power is changed in the course of successive exposures of various shot regions over the wafer. Such a procedure leads to increasing the time necessary to process each wafer and lowering the throughput of photolithographic process.

SUMMARY OF THE INVENTION

It is therefore a first object of the present invention to provide an exposure method and an exposure apparatus to enable to prevent the reduction of the throughput, without decreasing the control of exposure level precision, when exposing a plurality of regions (or sub-regions) defined on a wafer at different target exposure levels.

It is a second object of the present invention to provide an exposure method and an exposure apparatus based on the scanning exposure method using pulses of laser light to prevent the reduction of the throughput and the loss of precision in exposure level control when exposing sub-regions on a wafer at different target exposure levels.

It is a third object of the present invention to provide an exposure method and an exposure apparatus to enable to quickly determine target exposure levels in a plurality of regions defined on a substrate base such as a wafer.

It is a further object of the present invention to provide a manufacturing method for high precision devices based on the present exposure method.

A first method is for exposing a pattern formed on a first object (11) onto a sub-divided region defined on a second object (14), and exposing the pattern successively on a plurality of divided regions (31(2, 1))~(31(5, 6)) defined on the second object so as to replicate the pattern in each of the divided regions, by moving the first object synchronously in relation to the second object through pulses of exposure beam emitted from a pulsed energy source (1), wherein the plurality of divided regions includes a plurality of subdivided regions having different target exposure levels, the method comprises the steps of: selecting a transmittance of light reducing member (3) disposed in an optical path of the exposure beam based on at least one target exposure level of the plurality of target exposure levels; and, when exposing the divided regions having different target exposure levels, adjusting exposure level control parameters according to individual target exposure levels without changing the selected transmittance of the light reducing member.

The exposure level control parameters, for example, include at least one parameter from a group of parameters that includes a width in the moving direction of the second object disposed in the path of the exposure beam, a moving speed of the second object, an oscillation frequency of the exposure beam produced by the pulsed energy source, and an energy of the exposure beam emitted from the pulsed energy source.

According to the present invention, after finishing scanning exposure of the first divided region and before performing scanning exposure of the second divided region, a new target exposure level can be obtained by adjusting the parameters that can control the integrated exposure level (exposure level control parameters) without changing the setting of transmittance of the light reducing member. Accordingly, it is possible to eliminate those processes required for test emission, mechanical adjustments (switching of filters in the light reducing member, for example), thereby preventing the reduction of the throughput of the projection exposure apparatus. In the present method, because the pulses of laser light are used, it is preferable, within a range of appropriate frequencies, to also satisfy a condition that each divided region on the second object be exposed with a number pulses exceeding the minimum number of pulses.

Also, in the present invention, target exposure levels are assigned to individual divided regions according to distances from a center of the second object, for example. This method is useful in adjusting the exposure levels when the differences in the line widths (produced after photographically developing the exposed pattern) are distributed roughly concentrically.

A second method for determining an exposure level of an exposure beam that illuminates a first object (11) and exposes successively a plurality of divided regions defined on a second object (14) so as to replicate an image of the first object in each of the divided regions, is to pre-determine different levels of target exposure levels for the plurality of divided regions defined on the second object, so that, when successively exposing the divided regions (31(2, 1)~31(5, 6)) defined on the second object, exposure levels of the exposure beam required for each divided region are assigned by changing exposure parameters without mechanically switching optical components or performing test emissions of the exposure beam.

The present invention prevents the reduction of the throughput as in the first exposure method when changing the exposure level during the exposure process, because mechanical switching of filters and test emission of exposure beam are not necessary.

In the above exposure method, the exposure beam is comprised by pulses of laser beam output from a pulsed light source, and when each divided region on the second object is exposed by moving the second object relative to the first object through the exposure beam in synchronization, it is desirable that at least one of the control parameters including an oscillation frequency of the pulsed light source, a target pulse energy of each pulse emitted from the pulsed light source, and a scanning speed of the second object, is changed in order to assign an exposure level of the exposure beam to each divided region. This is an application of the second exposure method to the scanning exposure process, so the above condition to expose with a number of pulses exceeding the minimum number of pulses can be satisfied by changing one of the three exposure parameters or one combination of the exposure parameters.

Next, a first exposure apparatus for emitting an exposure beam to illuminate a first object (11) and exposing a plurality of divided regions defined on a second object (14) successively with an exposure beam through a pattern formed on the first object, is comprised by: a pulsed light source (l) for generating pulses of light to serve as an exposure beam; a stage system (15, 19, 20) for moving the first object synchronously with the second object; a memory section for storing target exposure levels in a plurality of different levels for a plurality of divided regions defined on the second object; and a control system (26) for adjusting at least one exposure parameter in preparation for successively exposing the plurality of divided regions defined on the second object according to the target exposure levels stored in the memory section (26a), wherein the one exposure parameter includes emission frequency of the pulsed light source, target per-pulse energy of the pulses emitted from the pulsed light source, and speed of scanning the second object controlled by the stage system.

A third exposure method is for determining an integrated exposure level in a process of successively projecting an image of a first object (11) through a projection optical system (13) on a plurality of divided regions defined on a second body (14), by detecting a level of reflected light reflecting from the second object or an evaluation body (14P) in place of the second object through the projection optical system; and determining a target exposure level for each of the plurality of divided regions defined on the second object.

According to this exposure method, the distribution of the target integrated exposure levels (set light exposure level) to produce optimal line widths, produced after developing a photo-sensitive material such as photoresist applied on the second object, is sometimes governed by the film thickness.

In such cases, by utilizing the fact that reflected light level is altered by the standing wave effects that is dependent on the film thickness, reflection light level from individual regions in the plurality of divided regions on the second object is measured, and film thickness in respective regions is determined according to the results of measurement. Then, target integrated exposure level can be optimized in each divided region according to pre-determined relationship of the film thickness to the optimal exposure level.

A second apparatus for determining an integrated exposure level in a process of successively projecting an image of a first object (11) through a projection optical system (13) on a plurality of divided regions defined on a second body (14), is comprised by: a detector (60) for detecting a level of reflected light reflecting from the second object through the projection optical system; and a control system for determining a target integrated exposure level for each of the plurality of divided regions according to output data from the detector.

In this case, it is preferable that the detector is used also for adjusting focusing properties of the projection optical system. According to this arrangement, the detector can determine the light level of the light reflecting from the second object and propagating through the projection optical system, so that changes in the aberration characteristics and other changes in the system can be determined from the measured results. Therefore, it is possible adjust the focusing properties of the projection optical system according to such real-time changes in the operating characteristics of the system.

A method of manufacturing a device according to the present invention includes the steps of imprinting a device pattern on a workpiece using the methods or the exposure apparatus described above. According to this method, the pattern formed on the first object is a device pattern and the second object is a workpiece (a substrate such a wafer), and because the integrated exposure level can be controlled with precision, high precision devices having superior performance properties, such as controlled widths of fine circuit lines, can be mass produced.

BRIEF EXPLANATION OF THE DRAWINGS

FIG. 5 is a flowchart of the pre-processing steps for scanning exposure process.

FIG. 6 is a flowchart of the exposure level control process.

DESCRIPTION OF THE PREFERRED EMBODIMENTS

A preferred embodiment will be explained in the following with reference to the drawings. This example is an application of the present method of exposure level control, based on the step-and-scan method, to the present projection exposure apparatus having an excimer laser light source to produce pulses of laser light.

Figure 1:
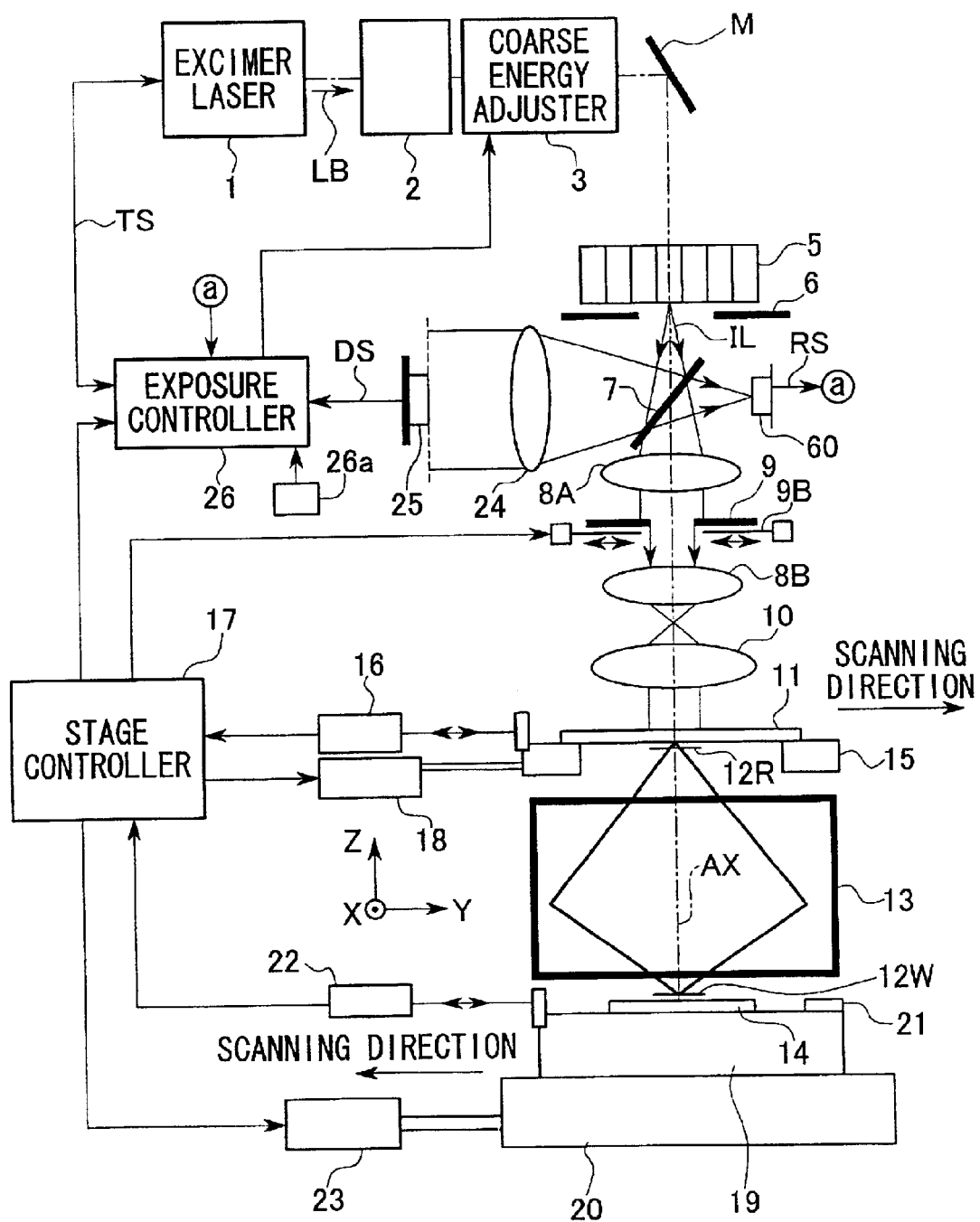
FIG. 1 is a schematic drawing of a projection exposure apparatus based on the step-and-scan method in a first embodiment of the present invention.

The exposure apparatus is shown in FIG. 1. Referring to FIG. 1, a laser beam LB for exposure, emitted from an excimer laser light source 1 is shaped by the beam shaping optical system 2 comprised by cylindrical lenses and beam expanders to adjust the cross sectional shape so as to be efficiently injected into the flyeye lens 5 acting as an optical integrator (homogenizer). Excimer laser light source 1 includes such excimer lasers as KrF laser (wavelength 248 nm) or ArF laser (wavelength 193 nm). Also, instead of the excimer laser light source 1, the present invention can also be applied to other pulse generation type lasers such as $F_2$ laser (wavelength 157 nm) or $Kr_2$ laser (wavelength 146 nm). The present invention may also be applied to harmonic wave generators such as metal vapor lasers and YAG laser, or semiconductor lasers in conjunction with erbium-doped fiber amplifier (EDFA) to amplify waves and convert wavelength.

Figure 3:
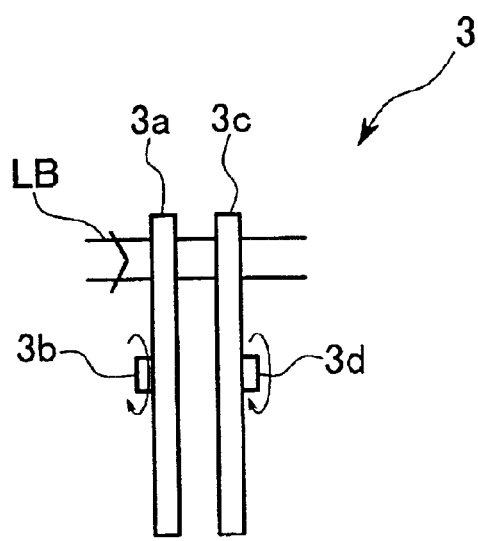
FIG. 3 is an example of the structure of the coarse energy adjuster 3 shown in FIG. 1.

The laser beam LB emitted from the beam shaping optical system 2 enters the coarse energy adjuster 3. As shown in FIG. 3, the coarse energy adjuster 3 is comprised by a plurality of neutral density (ND) filters having different transmissivity (1-transmittance), disposed on top of a freely rotating two-stage revolver 3a, 3c revolving about the respective driving motors 3b, 3d, and is designed to reduce transmittance for the incident laser beam LB from 100% in several steps. Here, the coarse energy adjuster 3 may be comprised by a one-stage revolver having a plurality of ND filters, or may be comprised by a one-stage or multi-stage filter switching member having a plurality of mesh filters and the like having different transmittance.

Returning to FIG. 1, the laser beam LB emitted from the coarse energy adjuster 3 enters the flyeye lens 5 through an optical path-bending mirror M. The flyeye lens 5 forms a multitude of secondary light sources for illuminating the reticle 11 with uniform illumination.

An aperture stop (so-called σ-stop) 6, which is a part of the illumination system, is provided on the output surface of the flyeye lens 5, and the laser beam (referred to as illumination pulse IL) emitted from the secondary light source inside the aperture stop 6 enters a beam splitter 7 having a low reflectance and high transmittance. The illumination pulse IL that passed through the beam splitter 7 now serves as the exposure beam, and passes through a rectangular opening of the fixed illumination field stop (fixed reticle blind) 9A by way of the first relay lens 8A. Also, in the vicinity of the fixed illumination field stop 9A is disposed a movable illumination field stop 9B, having an opening section whose width is adjustable and whose position is adjustable in the scanning direction of the reticle 11. This design is intended to prevent exposure of unnecessary parts of an exposure region, by further restricting the movable illumination field stop 9B at the beginning and end of scanning exposure. In this case, the movable illumination field stop 9B is disposed on the conjugate plane with respect to the patterned surface of the reticle, and the fixed illumination field stop 9A is disposed at a slightly defocused position from the conjugate plane.

The illumination pulse IL that propagated through the fixed illumination field stop 9A and the movable illumination field stop 9B, further passes through the second relay lens 8B and the condenser lens 10, and distributes illumination uniformly over a reticle illumination region 12R of a rectangular shape on the reticle 11 held on the reticle stage 15. The pattern inside the reticle illumination region 12R on the reticle 11 is reduced in a size by projecting through the projection optical system 13 at a projection magnification $M_{RW}$ (where $M_{RW}$ may be ¼, ⅕, ⅙ for example), and is focused onto the wafer exposure region (illumination field) 12W of a rectangular shape on the wafer 14 coated with a photoresist film, which is the in substrate base to be exposed. Wafer 14 may be a semiconductor (silicon) or silicon on insulator (SOI) and the like substrate materials of a circular shape. In the following presentation, z-axis refers to an axis parallel to the optical axis AX of the projection optical system 13, y-axis to the scanning direction of the reticle 11, with respect to the reticle illumination region 12R, lying on a plane orthogonal to the optical axis AX (i.e., the plane of the paper in FIG. 1), and x-axis to a non-scanning direction perpendicular to the scanning direction.

The reticle stage 15 is moved on a reticle base (not shown) in y-direction at a constant scanning speed by a reticle stage drive section 18 driven by a linear motor, for example, and is micro-adjusted in x-, y- and rotational directions to correct for any synchronization errors.

The position data of the reticle stage 15 represented by x-, y-coordinates and rotation angle determined by the moving mirror fixed on the reticle stage 15 and an external laser interferometer 16 are supplied to the stage controller 17, which controls the position and speed of the reticle stage 15 through the reticle stage drive section 18, according to the position and other data In the meantime, the wafer 14 mounted on a wafer holder (not shown) is placed on a Z-tilt stage (specimen stand) 19, and the z-tilt stage 19 is mounted on an x-y stage 20. The x-y stage 20 is used to stepwise move the wafer 14 on a wafer base (not shown) in x- and y-directions, as well as to move the wafer 14 at a constant speed in y-direction (for scanning). The z-tilt stage 19 is used to adjust the position of the wafer 14 in the z-direction (for focusing), and also to adjust the tilt angle of the wafer 14 with respect to the x-y plane. The position data such as x-, y-coordinates and rotational angle of the x-y stage 20 determined by the moving mirror fixed on the z-tilt stage 19 and the external laser interferometer 22 are supplied to the stage controller 17, which controls the position and speed of the x-y stage 20 by means of the wafer stage drive section 23 having, e.g., a linear motor, according to the position data The wafer stage is comprised by the z-tilt stage 19 and the x-y stage 20.

Also, the stage controller 17 is operated by a central controller (not shown) that controls the overall operation of the projection exposure apparatus. The scanning exposure process consists of repeating the step-and-scan operation, which is described below, for each shot region on the wafer 14. The step-and-scan operation consists of the following sequences: first sequence is to move a shot region (on the wafer 14) to be exposed to the scan-start position by step movement of the x-y stage 20; the second sequence is to move the reticle 11 in the +y (or −y) direction in relation to the reticle illumination region 12R at a speed $V_R$, by means of the reticle stage 15; and synchronously the wafer 14 is moved in the +y (or −y) direction at a speed $M_{RW} \cdot V_R$ (where $M_{RW}$ is a projection magnification factor from the reticle 11 to wafer 14) in relation to the wafer exposure region 12W, using the x-y stage 20. By repeating this process for all the shot regions on the wafer 14, reduced images of the pattern of the reticle 11 is imprinted over all the shot regions defined on the wafer 14. Here, the reason for scanning the reticle 11 and the wafer 14 in opposite directions is that the projection optical system 13 in this case is based on inverted image projection. If the projection optical system 13 is based on normal image projection, the scanning directions for reticle 11 and wafer 14 will be the same.

Also, an illumination uniformity sensor 21 comprised by a photoelectric converter is provided at all times in the vicinity of the wafer 14 mounted on the z-tilt stage 19 so that the receiving surface of the illumination uniformity sensor 21 is at the same height as the surface of the wafer 14. The illumination uniformity sensor 21 should be based on a photoelectric sensors such as photodiode or photomultiplier and the like that responds to the waves in the same wavelength region as the illumination pulse IL (100~300 nm, for example) and has a high response frequency to able to detect illumination pulse. The detected signals of the illumination uniformity sensor 21 are supplied to the exposure controller 26 by way of a peak hold circuit (not shown) and an analogue/digital converter (A/D converter).

In FIG. 1, the illumination pulse IL emitted from the flyeye lens 5 and reflected by the beam splitter 7 is received by way of the focusing lens 24 in the integrator sensor 25 comprised by a photoelectric converter, and the photoelectrically converted signals from the integrator sensor 25 are supplied as outputs DS [digit] to the exposure controller 26 by way of the peak hold circuit (not shown) and the A/D converter. The correlation coefficient α1 between the outputs DS from the integrator sensor 25 and the pulse energy per unit area of the wafer surface (exposure level in mJ/cm$^2$) produced by the illumination pulse IL has been predetermined determined, and this correlation coefficient al is stored in a memory section 26a such as a magnetic disc connected to the exposure controller 26. The exposure controller 26 controls laser emission timing and power of the excimer laser light source 1 by synchronizing its operation to the operating data of the stage system (reticle stage 15 and wafer stages 19, 20) forwarded from the stage controller 17, and by supplying the control data TS to the excimer laser light source 1. Further, the exposure controller 26 controls transmittance of exposure light by switching the ND filter in the coarse energy adjuster 3, and stage controller 17 controls the opening/closing of the movable illumination field stop 9B in synchronization with the operation of the stage system.

A reflection level monitor 60 (corresponds to the detector in the present invention), comprising a photoelectric converter, is disposed on the reflection surface on the rear side of the beam splitter 7 so as to be conjugate to the pupil surface of the illumination optical system. In this structure, the illumination pulse IL reflected at the wafer 14 (reflected light) returns from the projection optical system 13 to the beam splitter 7 through the relay lens 8A, and the light reflected from the beam splitter 7 is received in the reflection level monitor 60, and the detection signals RS from the reflection level monitor 60 are supplied to the exposure controller 26. During the exposure process, the light level (referred to as the first light level) entering the projection optical system 13 is monitored by the integrator sensor 25, and the light level that passes through the projection optical system 13 for the second time (referred to as the second light level), by reflecting from the wafer 14, is monitored by the reflection level monitor 60. Therefore, it is possible to monitor the total light level of the light that passes through the projection optical system 13 by adding the first light level and the second light level.

Also, focusing properties, such as the distortion in the projection optical system 13 (including magnification error) and best focus position, undergo changes chronologically, according to the integrated value of the overall power level of the beams passing through the projection optical system 13. For this reason, the relationship between the integrated value of the overall light level and changes in the focusing properties in the projection optical system is pre-recorded in the memory section 26a, and during the exposure process, the exposure controller 26 obtains the integrated value of the total light level from the detected outputs, respectively, of the integrator sensor 25 and the reflection level monitor 60, and obtains the change in the focusing properties in the projection optical system 13 from the integrated values. Then, if there is a danger that the change in the focusing properties exceeds the allowable range, the exposure controller 26 can adjust the focusing properties of the projection optical system 13 by means of a focusing property correction devices (not shown, but includes devices for operating a part of the projection optical system 13, for example), or adjusts the focusing position of the wafer 14 appropriately to the observed change in the best focus position, thereby performing exposure operation at its optimum at all times.

Also, as will be described later, the reflection level monitor 60 in this embodiment can function as a sensor for measuring the thickness distribution of the photoresist film applied to the wafer 14. This structure simplifies the projection exposure apparatus.

Next, the structure of the exposure level control system will be explained with reference to FIG. 2.

Figure 2:
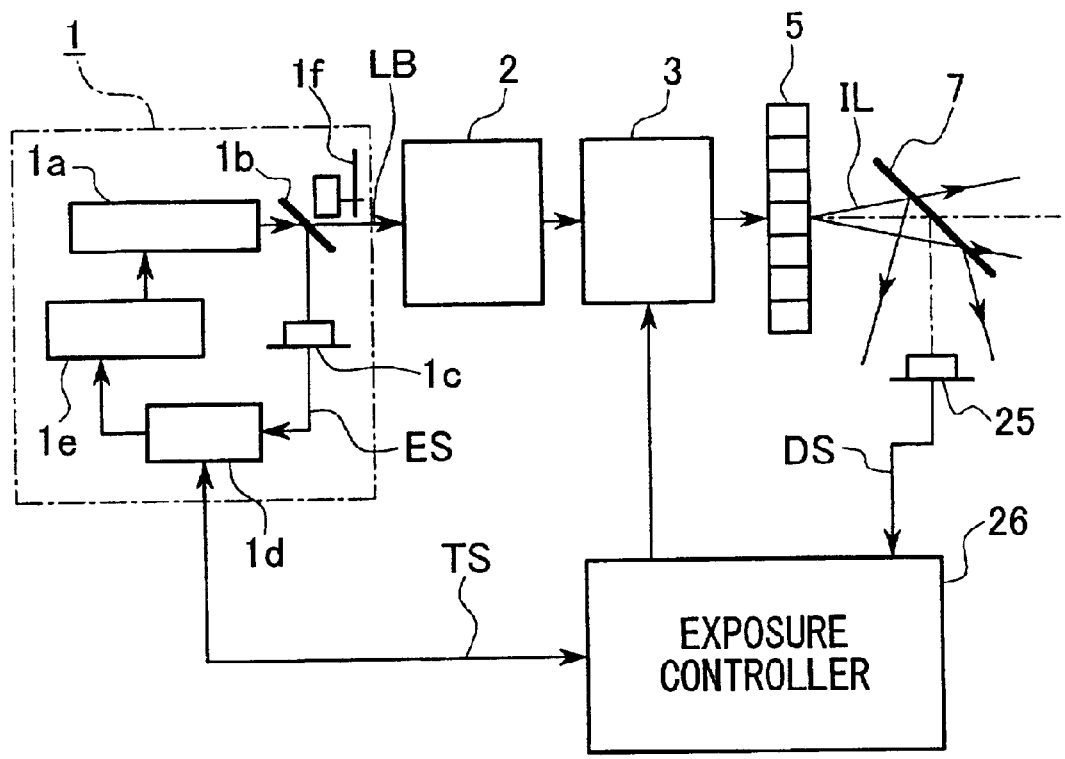
FIG. 2 is a block diagram of the exposure level control system of the projection exposure apparatus shown in FIG. 1.

FIG. 2 shows the exposure level control system of the projection exposure apparatus shown in FIG. 1. Laser beam emitted in the form of pulses from the laser resonator 1a in the interior of the excimer laser light source 1 enters the beam splitter 1b having high transmittance and low reflectance, and the laser beam LB transmitted through the beam splitter 1b is emitted externally. The laser beam reflected from the beam splitter 1b is received in the energy monitor 1c comprising a photoelectric converter, and the photoelectrically converted signals from the energy monitor 1c are supplied as output ES to the energy controller 1d through the peak hold circuit (not shown). The energy monitor 1c measures energy levels according to the output ES in units of mJ/pulse. During the normal pulse emitting process, the energy controller 1d controls the source voltage of the high voltage source 1e so that the output ES agrees with a target value per-pulse energy contained in the control data TS supplied from the exposure controller 26, resulting that the per-pulse energy in the laser resonator 1a will be determined by the source voltage. By following such a procedure, the average pulse energy of the laser beam LB emitted from the excimer laser light source 1 is adjusted to the value demanded by the exposure controller 26.

The average per-pulse energy from the excimer laser light source 1 is stabilized normally about a center value $E_0$, but is permitted to vary within a given range above and below the center value $E_0$. Also, a shutter 1f is provided near the outside of the beam splitter 1b inside the excimer laser light source 1 for blocking the laser beam LB according to control data from the exposure controller 26.

Referring to FIG. 2, during the computation or resetting process of the correlation coefficient to be described later, the amount of adjustment to be made according to the output ES from the energy monitor 1c is supplied through the energy controller 1d to the exposure controller 26, which then correlates the adjustment amount for the output ES from the energy monitor 1c and the output DS from the integrator sensor 25. During the scanning exposure process, the exposure controller 26 sends certain control data TS to the energy controller 1d so. as to permit the excimer laser light source 1 to generate pulses essentially at a constant cycle, and to integrate the output DS from the integrator sensor 25 for each illumination pulse so that true integrated exposure level at each successive point on the wafer 14 can be obtained indirectly. And, the exposure controller 26 adjusts transmittance of the coarse energy adjuster 3 and performs micro-adjustment of the per-pulse energy of the laser beam emitted from the excimer laser light source 1 so that the set exposure level as each point passes the wafer exposure region 12W shown in FIG. 1 matches the set exposure level (target exposure level) set for the photoresist film applied on the wafer 14 within an allowable range. This process will be described more fully later.

Next, an example of the process of exposure level control by the projection exposure apparatus will be explained in detail with reference to the flowcharts shown in FIGS. 5, 6. First, in this example, for the photoresist film applied on a particular layer to be exposed at this time, assigned exposure levels representing the target exposure levels (target values of the integrated exposure energy) are different for different position within the wafer depending on the locations of the shot regions. However, the target values are the same for all the wafers within a certain lot number.

Figure 4:
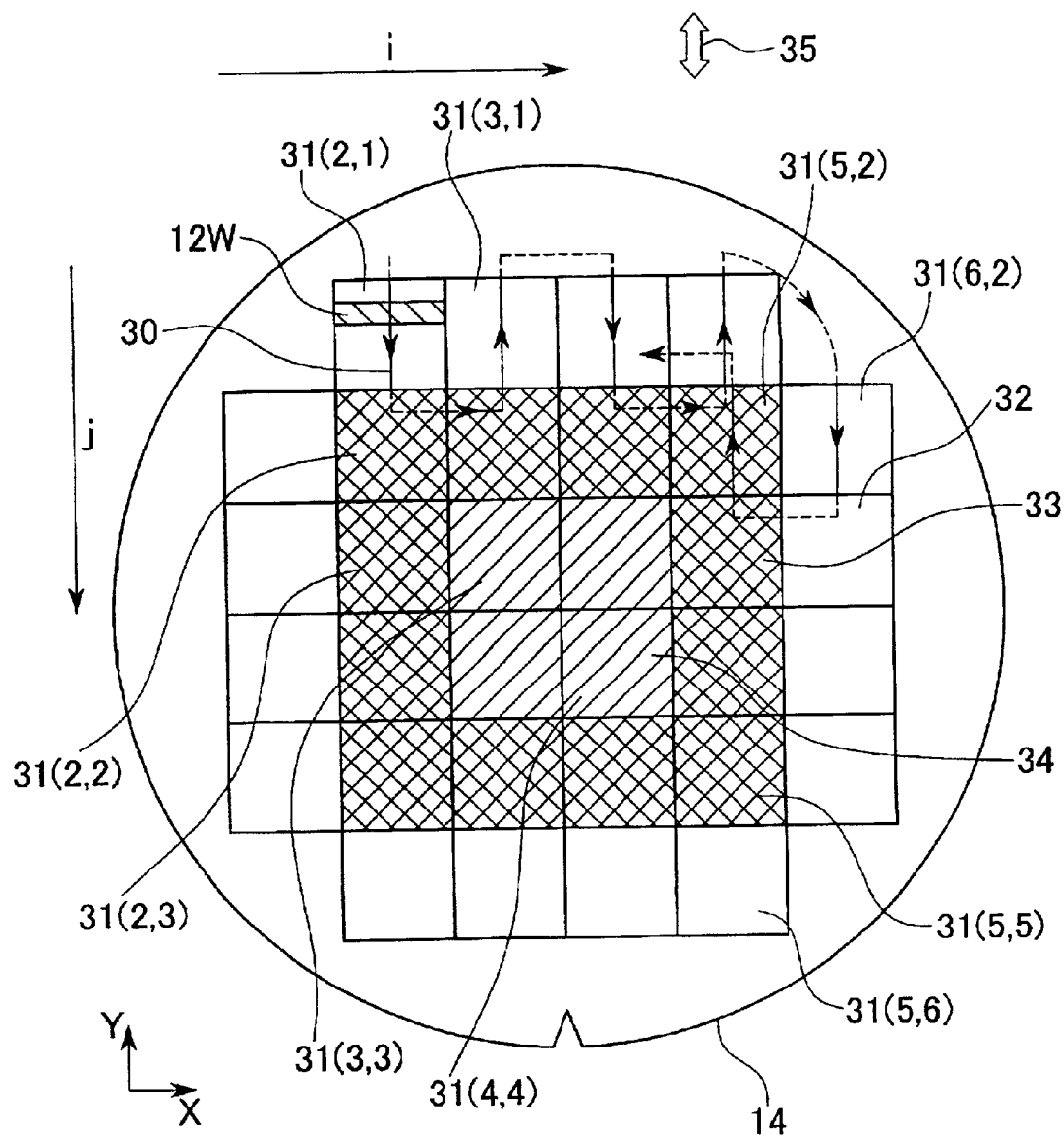
FIG. 4 is a plan view of a shot map of a wafer to be exposed.

FIG. 4 shows one example of such a wafer 14 to be exposed at this time. In FIG. 4, the target exposure area on the wafer 14 is divided into a plurality of rectangular shot regions (corresponding to the term divided regions in the present invention) at a given spacing in x-, y-directions, and each shot region is referred to as shot region 31 (i, j), indicating that the region is located in the i-th spot in x-direction (i=1~6) and in the j-th spot in y-direction (j=1~6). In this case, a target exposure level S1 is assigned to the outer shot regions consisting of sixteen shot region 31 (2,1) to shot region 31 (5,6) in the first sub-region 32; and a target exposure level S2 is assigned to the twelve shot-regions 31 (2,3) to 31 (5,5) in the second sub-region 33; and a target exposure level S3 is assigned to the four shot-regions 31 (3,3) to 31 (4,4) in the third sub-region 34. Therefore, there are three different target exposure levels to be assigned to the same wafer. In other words, the assigned exposure levels Sk (k=1, 2, 3) are assigned roughly concentrically in three levels, in this example, about the center of the wafer 14.

An example of the method of assigning the exposure level Sk will be explained. First, $N_w$ pieces of unexposed test wafers having the same type of photoresist coating as the object wafer 14 are prepared (more than three pieces in this example). Successive shot regions in each of the $N_w$ pieces of test wafers are exposed with slightly different levels of exposure centered about the design value of the integrated exposure level to imprint the pattern image of the reticle 11. After developing all the test wafers, the line widths of the resist patterns formed in each shot region in all the test wafers are computed using a scanning electron microscope (SEM), for example, so as to obtain an optimal exposure level for each shot region, which is an integrated exposure level that produces a line width closest to the target line width. In performing this test, an optimal exposure level may be obtained by interpolating between two values of the integrated exposure levels. If a group of shot regions have the values of the optimal exposure level within an allowable range, then, to simplify the exposure level control process, an average value of the optimal exposure level is used as a common assigned exposure level Sk for that group of shot regions. By following such a procedure, it becomes possible to establish a target exposure level to obtain the target line width for each group of shot regions distributed over a plurality of sub-regions defining the wafer areas to be exposed.

As mentioned earlier, such variations in the line widths of the photoresist patterns are caused by variations in the thickness of the applied photoresist film and non-uniformity in the standing wave effects within the photoresist film produced by such thickness variations; however, such thickness variations are generally produced concentrically about the center of the wafer. Therefore, the distribution of assigned exposure levels Sk for eliminating the differences caused by non-uniform coating thickness tends also to be concentric about the center of the wafer 14 as illustrated in FIG. 4. Also, non-uniformity produced in developing the photoresist film can sometimes be generated concentrically about the center of the wafer, and in such a case, the distribution of assigned exposure level Sk will also be concentric about the center of the wafer. It follows that by arranging the assigned exposure levels Sk concentrically about the center of the wafer, it is possible to correct those variations in line widths that are concentric about the center of the wafer, caused by such problems as non-uniform thickness of photoresist film.

It should be noted that, to correct the line width variations even more precisely, the wafer exposure area may be sub-divided into a larger number of sub-regions to allocate individual values of assigned exposure levels, or an assigned exposure level may be allocated individually for each shot region or for a plurality of position within the wafer.

As described above, assigned exposure levels Sk are determined for a plurality of sub-regions in each layer of the device wafer, and the data determined for the assigned exposure levels Sk are stored together with the corresponding locations (i, j) of each shot region in the exposure data file of the host computer (not shown).

Referring to step 101 in the flowchart in FIG. 5, the operator of the exposure apparatus refers to the stored data in the exposure data file in the host computer to access the data of the assigned exposure levels Sk for a plurality of sub-regions in the layer to be exposed in the wafer, at this time. The data for the assigned exposure levels Sk in mJ/cm$^2$ for each location (i, j) of the shot region of the wafer are then transferred as a table to the memory section 26a of the exposure controller 26. In this example, the assigned exposure levels Sk are allocated in three levels (k=1, 2, 3) as S1, S2, S3.

In the next step S102, assuming the transmittance of the coarse energy adjuster 3 in FIG. 1 is set at 100% and not mounting the wafer, which is the exposure target, on the z-tilt stage 19, the exposure controller 26 sets the output (pulse energy) of the exposure light source served by the excimer laser light source 1 in this example, to a central value $E_0$ (neutral value) within the allowable range. Then, in step 103, the exposure controller 26 commands the excimer laser light source 1 to test its operation by emitting several tens of test pulses, for example, and simultaneously, obtains the output DS [digit] for each pulse output from the integrator sensor 25, and computes an average pulse energy P in mJ/cm$^2$ on the image plane (wafer surface) of the projection optical system 13, using the output DS and the correlation coefficient α1 in the following relation.

$$P = \alpha 1 \cdot DS \tag{1}$$

In this process, as shown in FIG. 2, the exposure controller 26 fetches the output ES [mJ/pulse] from the energy monitor 1c for each pulse, serving as the internal sensor of the power from the excimer laser light source 1, and computes a correlation coefficient α2 (α2=ES/DS) for converting the output DS from the integrator sensor 25 to the output ES from the energy monitor 1c. This correlation coefficient α2 is also stored in the memory section 26a. In this example, this correlation coefficient α2 is computed by performing test emission for each change in transmittance through the coarse energy adjuster 3.

Figure 7A:
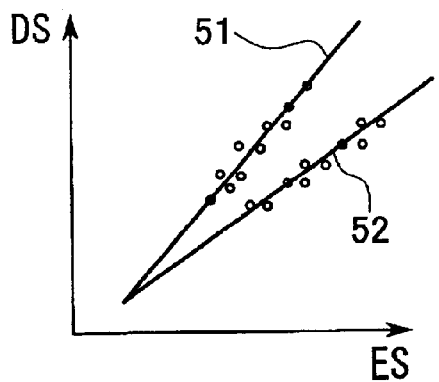
FIG. 7A is a graph showing an example of the correlation of output data from the integrator sensor 25 and the output data from the energy monitor 1c.

In this process, because there is scatter in the energy data of each pulse, measured data of output ED, DS are distributed along a straight line 51 as shown in FIG. 7A. For this reason, a reciprocal of the slope of the line 51 obtained by the least square method, for example, or an average value of the correlation coefficient α2 obtained for each pulse is ultimately used as the correlation coefficient α2.

By using this correlation coefficient α2, the exposure controller 26 is able to compute the output ES from the energy monitor 1c using the output DS from the integrator sensor 25 according to the following relation.

$$ES = \alpha 2 \cdot DS \tag{2}$$

Therefore, it is possible to control the output power of the excimer laser light source 1 using the output DS from the integrator sensor 25 as the reference.

Next, in step 104, the exposure controller 26 in FIG. 1 computes the number of exposure pulses Nk directed to one point on the wafer 14 for a plurality of assigned exposure levels Sk (k=1, 2, . . . ). That is, if function round (x) is a rounding function for rounding a variable x at a first decimal point, Nk is represented by the following relation to produce N1, N2 and N3.

$$Nk = \text{round}(Sk/P)(k=1, 2, 3) \tag{3}$$

Next, in step 105, to determine if the exposure pulse count Nk is higher than the pre-determined minimum number of pulses Noun necessary for determining the repeatability precision AE, for exposure level control, a number N is used to determine a effective minimum number of exposure pulse count (k=1, 2, . . . ). The parameter N can be obtained by a function min (x1, x2, . . .) shown below to obtain a minimum value.

$$N = \min(N1, N2, \ldots) \tag{4}$$

Then, in step 106, the effective minimum value N and the $N_{min}$ are compared. If $N < N_{min}$, the exposure pulse count Nk must be increased, and this can be accomplished by decreasing the average pulse energy P on the image plane according to relation (3). So, in step 107, the exposure controller 26 selects the highest value of transmittance that can be achieved in the coarse energy adjuster 3 in FIG. 1 from a plurality of stages of transmittance T within the restriction $N \geq N_{min}$, and adjusts the transmittance of coarse energy adjuster 3 to the selected value T. After this step, the program flow returns again to step 103, and repeats steps 103~106.

The above process results in resetting the average pulse energy P on the image plane under the re-adjusted transmittance T of the coarse energy adjuster 3 as well as the correlation coefficient α2 in relation (2) to convert the output DS from the integrator sensor 25 to the output ES from the energy monitor 1c. In this case, because the transmittance T of the coarse energy adjuster 3 is lowered, measured values of the output DS of the integrator sensor 25 and the output ES of the energy monitor 1cfollow a straight line 52 shown in FIG. 7A, and the correlation coefficient α2 increases. That is, the correlation coefficient α2 represents a function for indicating the stage of the transmittance T in the coarse energy adjuster 3. Then, when $N \geq = N_{min}$ is established in step 106, the action of the exposure controller 26 moves to step 108, and obtains, for every change in the assigned exposure levels Sk, a value Ptk representing the per-pulse energy (a real-time value on the image plane) of the pulses emitted from the excimer laser light source 1 from the relation (5) shown below.

$$Ptk=Sk/Nk(k=1, 2, 3) \tag{5}$$

By using these correlation coefficients al, α2 in the relation (6) shown below, it is possible to convert the assigned value Ptk to the output DS (=Ptk/α1) at the integrator sensor 25, and to further convert the output DS from the integrator sensor 25 to the output (denoted by Etk) from the energy monitor 1c in the excimer laser light source 1.

$$Etk=(\alpha2/\alpha1)Ptk \tag{6}$$

Subsequently, the control process proceeds to the scanning exposure phase in step 109. The details of the scanning exposure process is shown by the steps 111~118 in the flowchart in FIG. 6. In step 111 in FIG. 6, the exposure controller 26 determines scanning exposure conditions to be used in individual assigned exposure levels Sk (k=1, 2, ...), that is, an assigned exposure level Sk, an exposure pulse count Nk for each one point on the wafer, an emission frequency fk of the excimer laser light source 1, an assigned pulse energy Etk at the excimer laser light source 1, a wafer scanning speed Vk, and the common assigned value T of transmittance in the coarse energy adjuster 3. The values for Sk, Nk, Etk, and T are already pre-determined so that the only values that can be changed are emission frequency fk and the scanning speed Vk.

In this case, denoting scanning direction in the wafer exposure region 12W on the wafer 14 in FIG. 1 by Ws (which is fixed in this example), the maximum scanning speed of the wafer stage (x-y stage 20) by $V_{max}$, and the upper limit of emission frequency of the excimer laser light source 1 by $f_{max}$, to obtain maximum throughput from the exposure apparatus, the scanning speed is first set to Vk at its maximum speed $V_{max}$ and the emission frequency fk at a value to enable to expose each point on the wafer with Nk pulses (an whole number of pulses) so that $Nk=fk \cdot Ws/V_{max}$, and therefore:

$$Vk=V_{max}; \text{ and } fk=V_{max} \cdot Nk/Ws \tag{7}$$

However, if the operating conditions are such that $fk>f_{max}$, then fk is set to $f_{max}$, and the scanning speed Vk is selected so as to expose each point on the wafer with Nk pulses (integer) ($Nk=f_{max} \cdot Ws/Vk$). By so doing, the scanning speed Vk can achieve a maximum value under the limitation that the emission frequency of the excimer laser light source 1 is less than the maximum emission frequency $f_{max}$, and therefore:

$$fk=f_{max}; \text{ and } Vk=Ws \cdot f_{max}/Nk \tag{8}$$

The scanning exposure conditions thus chosen (Sk, Nk, Etk, T, fk, Vk) are stored in the memory section 26a to correspond to each location (i, j) in the shot region 31 (i, j) on the wafer 14 in FIG. 4. In this case, the assigned value T of the coarse energy adjuster 3 for transmittance is common to the whole shot regions (meaning a common assigned exposure level Sk).

Next, in step 112, the reticle 11 on the reticle stage 15 shown in FIG. 1 is aligned rusing the alignment sensor (not shown). Next, in step 113, in preparation for next exposure step, the exposed wafer is removed from the z-tilt stage 19 in FIG. 1, and an unexposed wafer is loaded, and this wafer 14 is aligned using the not-shown alignment sensor.

Next, as shown in FIG. 4, it is assumed that exposure is carried out by moving the exposure region 12W along the track 30 relative to the wafer (in reality, wafer 14 is moved), shot regions 31(2, 1), 31(3, 1), . . . will be exposed successively. Therefore, in step 114, the exposure controller 26 obtains scanning exposure conditions (Sk, Nk, fk, Etk, Vkc, T) for the next location on the wafer to be exposed from the memory section 26a, and enters these conditions in the excimer laser light source 1 and the stage controller 17. Specifically, information on emission frequency fk and the pulse energy Etk is supplied to the excimer laser light source 1 and information on the scanning speed Vk is supplied to the stage controller 17.

Next, in step 115, pulse emission is commenced from the excimer laser light source 1, and as shown in FIG. 4, scanning exposure is carried out by scanning the wafer 14 with respect to the wafer exposure region 12W at the scanning speed Vk in the scanning direction (y-direction) to perform scanning exposure on the shot region. The exposure level control is carried out as follows.

In this example, the exposure controller 26 shown in FIG. 1 resets the pulse counter comprising an internal register for summing the pulse counts n before commencing pulse emission from the excimer laser light source 1. After which, the reticle 11 and wafer 14 are synchronously moved at respective constant scanning speeds so that just before the edge of the target exposure region on the wafer 14 nears the wafer exposure region 12W (pulse emission commencing point), the exposure controller 26 permits the excimer laser light source 1 to start emitting pulses of laser beam. The exposure controller 26 measures the pulse energy of each illumination pulse IL through the integrator sensor 25.

In this example, the pulse emission from the excimer laser light source 1 is controlled by feedback in such a way that the integrated energy per given number of pulse units stays constant. That is, the excimer laser light source 1 is power-locked in the initial stage of operation so that in a unit time $T_{unit}$ (which varies according to emission frequency fk), a given counts of pulse $N_{unit}$ are generated (where $N_{unit}$ is less than the minimum exposure pulse counts $N_{min}$), and that the integrated energy value of energies output during the unit time $T_{unit}$ and measured by the energy monitor 1c will be equal to $Etk \cdot N_{unit}$. However, this approach alone produces too much scatter in the pulse energy and a danger of the integrated exposure level to drift away from the assigned exposure level Sk. For this reason, pulse energy of pulses emitted from the excimer laser light source 1 is adjusted according to the measured values of the integrator sensor 25 so as to eliminate the error portion of the pulse energy.

Here, the pulse energy measured in the integrator sensor 25 when the i-th pulse (i=0, 1, 2, . . . ) is generated is denoted by $P_i$, and $P_0$ is assumed to be zero. Men, using the measured value Pi, the exposure controller 26 computes a target value of the pulse energy to be measured at the time of emission of the next pulse, and enters this target value in the excimer laser light source 1. An example of computation of such a pulse energy computation method will be explained below with reference to a simplified case shown in FIG. 9.

Figure 9:
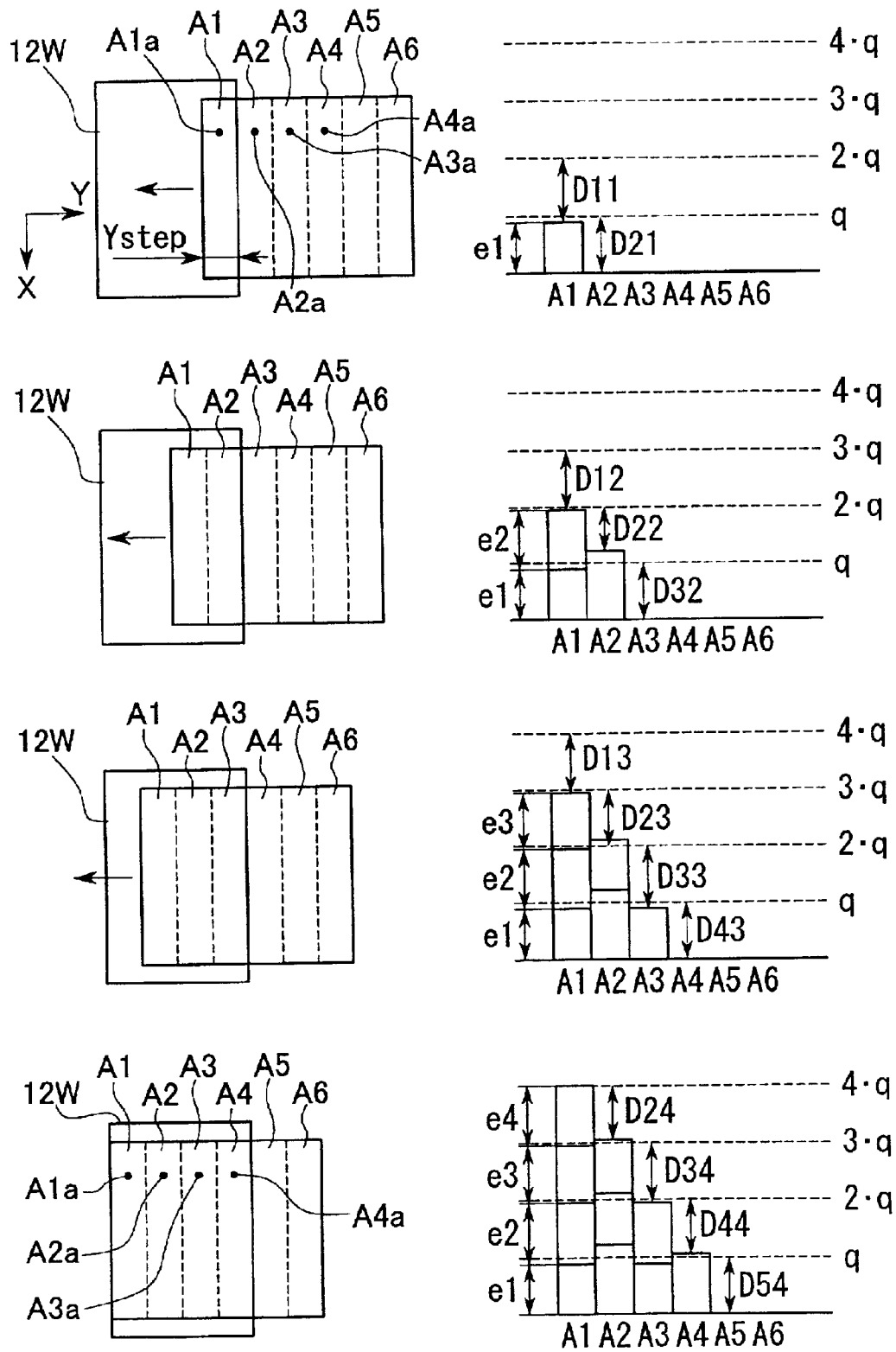
FIG. 9 is a graph to explain a process of computing the target energy of the next pulse of light.

FIG. 9 shows a case of scanning exposure performed by moving the wafer 14 in the negative direction along the y-axis relative to the wafer exposure region 12W. In this process, the distance moved by the wafer 14 during one cycle of pulse emission is denoted by $Y_{step}$, and the shot region on the wafer 14 is divided into partial regions A1, A2, ... A6 in such a way that the width of each partial region in the y-direction is equal to $Y_{step}$. Also, to simplify the explanation, the width in the scanning direction of the wafer exposure region 12W is assumed to be four times the distance $Y_{step}$. It follows that the exposure pulse count at each point on the wafer 14 will be four, and the target value of the integrated exposure level at each point will be 4·q so that the target values of integrated exposure levels for pulse-1 to pulse-4 will be q~4q, respectively, where q represents an exposure level target value for one pulse unit of pulse energy. Also, individual points within each partial region A1, A2, A3, ... on the wafer 14 may be designated as A1a, A2a, A3a, ... and so on. Or, individual points on the wafer 14 may be designated by a line of points distributed in y-direction at a spacing $Y_{step}$.

The result is that when the first partial region A1 (or point A1a, likewise for others below) enters the wafer exposure region 12W, an exposure by pulse-1 is carried out at exposure level q (step a in FIG. 9), and the actual exposure level e1 is measured through the integrator sensor 25, and the target exposure level D11 to be assigned to the partial region A1 is obtained as follows. Also, the target exposure level D21 for the second partial region A2 is q.

$$D11 = 2 \cdot q - e1 \tag{B1}$$

$$D21 = q \tag{B2}$$

Next, when the second partial region A2 enters the wafer exposure region 12W, an exposure by pulse-2 is carried out at a target value e2' computed according to the following relation using weighting W1 and W2 (refer to step b in FIG. 9).

$$e2' = (W1 \cdot D11 + W2 \cdot D21)/(W1 + W2) \tag{B3}$$

The actual exposure level e2 produced by pulse-2 is also measured, and the target exposure levels D12, D22, D32 to be applied to successive partial regions A1, A2, A3 are obtained as follows.

$$D12 = 3 \cdot q - (e1 + e2) \tag{B4}$$

$$D22 = 2 \cdot q - e2 \tag{B5}$$

$$D32 = q \tag{B6}$$

Next, when the third partial region A3 enters the wafer exposure region 12W, an exposure by pulse-3 is carried out at a target exposure level e3' to be computed according to the following relation using weighting W1, W2, W3.

$$e3' = (W1 \cdot D12 + W2 \cdot D22 + W3 \cdot D32)/(W1 + W2 + W3) \tag{B7}$$

Next, based on the measured value of exposure level e3 produced by pulse-3, the target exposure values D13 to D43 to be assigned to the partial regions A1~A4 are obtained as follows.

$$D13 = 4 \cdot q - (e1 + e2 + e3) \tag{B8}$$

$$D23 = 3 \cdot q - (e2 + e3) \tag{B9}$$

$$D33 = 2 \cdot q - e3 \tag{B10}$$

$$D43 = q \tag{B11}$$

Then, the target exposure level e4' to be assigned to pulse-4 (refer to step d in FIG. 9) using weighting W1~W4 as follows.

$$e4' = (W1 \cdot D13 + W2 \cdot D23 + W3 \cdot D33 + W4 \cdot D43)/(W1 + W2 + W3 + W4) \tag{B12}$$

Subsequent target exposure levels Daj~Ddj (j=4, 5, ...) are determined similarly according to the measured (real-time) value of the exposure level produced by pulse-3 for the four partial regions (or a series of four points of spacing $Y_{step}$) as described in a series of relations B8~B11, and the exposure level to be assigned for the next pulse-n is computed by substituting the target values of exposure level Daj~Ddj in D13~D43 in relation B12.

In this process described in this example, weighting W1~W4 are selected as follows so that the values are the same or larger than the value near the exposure end point.

$$W1 \geq W2 \geq W3 \geq W4 \tag{B13}$$

Weighting may be selected also so that the values are effective only near the exposure end point such that:

$$W1 = W2 = 1, \text{ and } W3 = W4 = 0 \tag{B14}$$

Or, weighting may be selected so that the values increases rapidly, for example exponentially, near the exposure end point as follows.

$$W1 > W2 > W3 > W4 \tag{B15}$$

By providing such corrections, less scatter is produced in the integrated exposure level at each point on the wafer 14.

Figure 8:
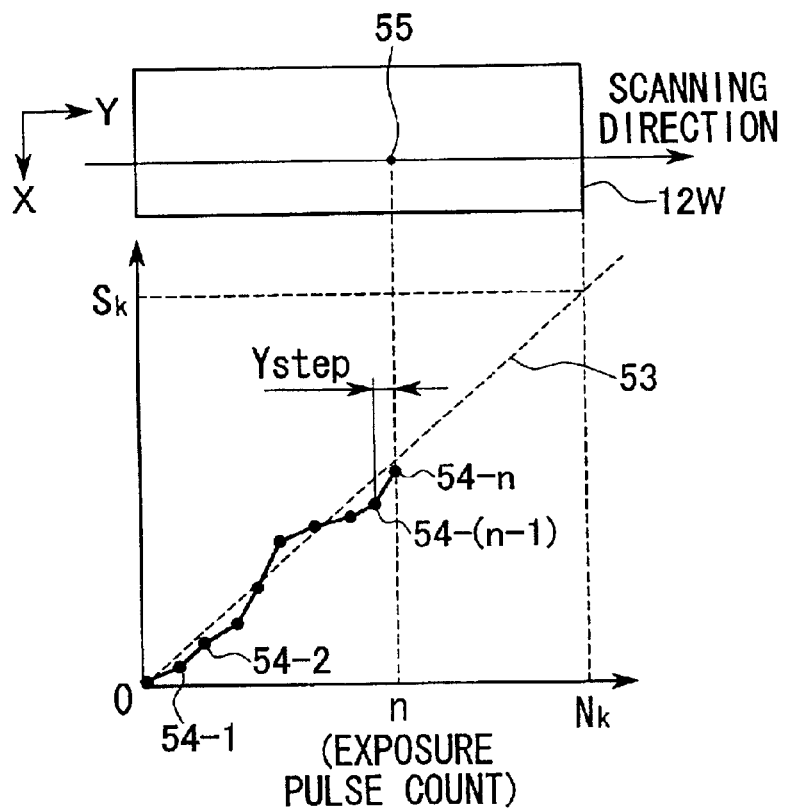
FIG. 8 is a graph for explaining a method for computing a target pulse energy when exposing a point on a wafer with a pulse-n.

Also, another method of computing the target value of pulse energy will be described in the following. As shown in FIG. 8, diagram a, it is assumed that the point 55 on the wafer 14 has already received exposure by (n−1) pulses so that pulse-n is yet to be applied. The control of pulse energy is carried out in units of pulses such that each unit has $N_{unit}$ number of emitted pulses.

Referring to FIG. 8, diagram a, the relative size of the wafer exposure region 12W in x-direction (non-scaling direction) is shown smaller than the actual relative size for convenience, and the scanning direction of the wafer exposure region 12W relative to wafer 14 is +y direction. Also, the bends 54-I~54-(n−1) in the solid line shown in FIG. 8, diagram b, represent integrated exposure levels applied to the point 55 in the course of moving relative to the wafer exposure region 12W, and the horizontal axis corresponds to y-coordinate when the point 55 is exposed by each exposure pulse. The dotted line 53 in FIG. 8, diagram b, relates to the target exposure level for respective pulse emissions, so that the object of exposure level control is to match the integrated exposure level for point 55, within an allowable range, to the assigned exposure level Sk by applying pulse-Nk.

In this case, an exposure value to correspond to the target exposure level q for the pulse energy per pulse unit in FIG. 9, which corresponds to a converted value obtained from the measured result in the energy monitor 1c, is the assigned exposure level Ek (=Sk/Nk). If the pulse energy $P_i$ produced by pulse-i and measured through the integrated sensor 25 is converted to the measured value $Ei(=\alpha 2 \cdot P_i)$ at the energy monitor 1c, then the target exposure level Etk(n) of pulse-n for the next point 55 to be exposed is obtained by using non-dimensional weighting $W_A$, $W_B$ as follows.

$$Etk(n) = Etk - W_A(E_{n-1} - Etk) - W_B \sum_{i=n-1-N_{unit}}^{i=n-1} (Ei - Etk) \quad (9)$$

In relation (9), the second term in the right side relates to an error annihilation term obtained by multiplying the error in the immediately preceding pulse energy $(E_{n-1}-Etk)$ by weighting $W_A$, and the third term in the right side relates to an error annihilation term obtained by multiplying the integrated value of the errors of the pulse energy provided by the preceding $N_{unit}$ pulses by weighting $W_B$. That is, in this example, control is based on the deviation of the pulse energy of one preceding pulse and the deviation in the two preceding pulse energy of $N_{unit}$ it pulses so as to match the next value as closely as possible to the target value Etk of exposure energy, and the use of a ratio of the two values of weighting $W_A$, $W_B$ enables to optimize the control precision. The exposure controller 26 outputs a pulse energy Etk(n) thus computed to the excimer laser light source 1 before each pulse emission so that the excimer laser light source 1 can emit the output pulse accordingly.

Also, the exposure controller 26 adds 1 to the value n of the internal pulse counter for each pulse emission, and determines whether the shot region to be exposed has passed the wafer exposure region 12W, that is, whether the wafer 14 has reached an end point of exposure. This can be determined from the location information and other data of each stage output from the stage controller 17. When the exposure end point is reached, scanning is finished, that is, the pulse generation process is stopped.

Also, in step 127, the exposure controller 26 computes the integrated exposure level $R_k$(k=1, 2, . . . ) on the image plane, for each point in the shot region that has been exposed at a spacing $Y_{step}$ by integrating the values of the pulse energy measured by the integrator sensor 25.

Figure 7B:
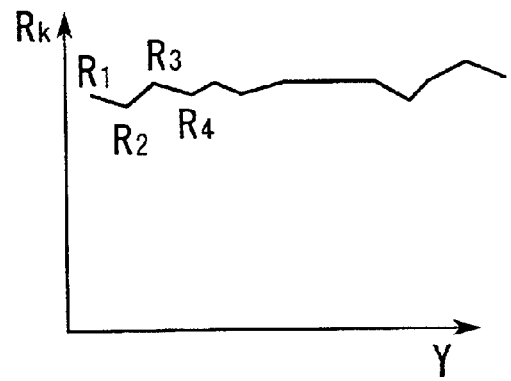
FIG. 7B is a graph showing an example of the integrated exposure levels in a series of points within a shot region on the wafer.

FIG. 7B shows an example of such integrated exposure levels $R_k$ computed for each point in the shot region, where the horizontal axis relates to direction y in the scanning direction inside the shot region of FIG. 7B. To perform this process, the exposure controller 26 obtains an average value $R_{ave}$ of a series of integrated exposure levels $R_k$, a maximum value $R_{max}$ and a minimum value $R_{min}$ and determines whether these values of the parameters $R_{Rav}$, $R_{max}$, $R_{min}$ are all within the respective allowable ranges, and the determined results are output to a main control system (not shown). After this step, the flow proceeds to step 116, and if there is a shot region to be exposed on the wafer 14, the flow proceeds to step 117, and performs the exposure operation by moving the next shot region to the scanning-start position and carries out steps 114~116 of the exposure operation.

In carrying out this process, referring to FIG. 4, the assigned exposure level is changed from S1 to S2 when moving from shot region 31(6, 2) to shot region 31(5, 2), and similarly, the assigned exposure level Sk is changed whenever it is required to move to different sub-regions. Subsequently, when all the shot regions are exposed, the flow proceeds from step 116 to step 118 to determine whether there are remaining unexposed wafers that belong to the same lot number. If there is unexposed wafer, steps 113~117 are repeated until there are no more unexposed wafers remaining, at which time, the exposure process is completed. The exposed wafers are processed through pattern fabrication process such as developing, etching and resist removal processes and others, so that they can be subjected to dicing, bonding and packaging processes and the like to produce final semiconductor devices.

As described in the example above, once the transmittance of the coarse energy adjuster 3 is adjusted by performing steps 101~108, neither mechanical adjustment of the coarse energy adjuster 3 nor test emission of the excimer laser light source 1 is necessary during the duration of exposure-start to exposure-end operation for wafers belonging to one production lot Therefore, high throughput of exposure processing is maintained. Also, because the wafers are exposed using more than the minimum number of exposure pulses $N_{min}$ and the pulse energy is micro-adjusted by varying the output power of the excimer laser light source 1, high precision of the exposure level control can be maintained.

Further, in the example described above, the micro-adjusting of the pulse energy can be carried out by adjusting at least one of the width of the exposure beam on the wafer in the moving direction of the wafer (Ws), the moving speed of wafer (Vk), the oscillation frequency of the exposure beam (fk), and the energy of the exposure beam emitted from the excimer laser.

Furthermore, in the example described above, the shot regions on the wafer 14 are exposed line-by-line (or column-by-column), as shown in FIG. 4, but other methods may be used. For example, a common exposure level may be applied to all the shot regions within the first sub-region 32, another common exposure level may be applied to all the shot regions within the second sub-region 33, and still another common exposure level may be applied to all the shot regions within the third sub-region 34. Such group-based processing of multiple shot regions may be employed so as to lessen the frequency of switching the exposure level control parameters and further facilitate the control process.

Also, when exposing the wafers within a given lot, it is desirable to process the leading wafer so as to prepare and store a table of control parameters, such as chip size (size of the shot region) and the distribution of assigned exposure levels and the like. The wafers that follow may then be exposed according to a pre-determined course of operation based on the contents of such a table, thus enabling to omit repetition of unnecessary measurement steps to further improve the processing capability of the exposure apparatus.

Next, a method of determining the assigned exposure level on the wafer using the reflection monitor 60 shown in FIG. 1 will be explained. In this case, a pilot wafer 14P having a photoresist coating that has been subjected to the same device fabrication process as the coating on the wafer 14 is mounted on the z-tilt stage 19 in FIG. 1. A pattern image formed on the reticle 11 is successively exposed to each shot region. In performing this process, average values RS1, RS2, . . . are obtained for each shot region through the reflection monitor 60.

Figure 10:
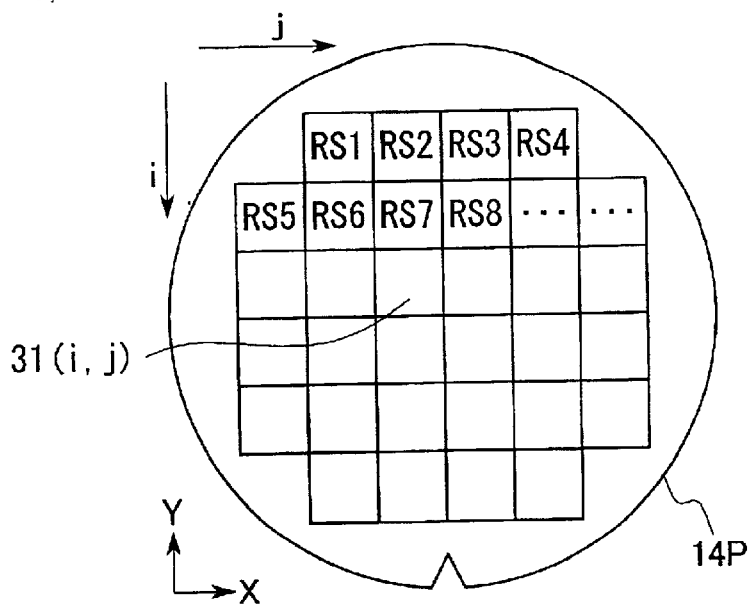
FIG. 10 is an illustration of the process of obtaining the reflection level for each shot region on the wafer.
Figure 12:
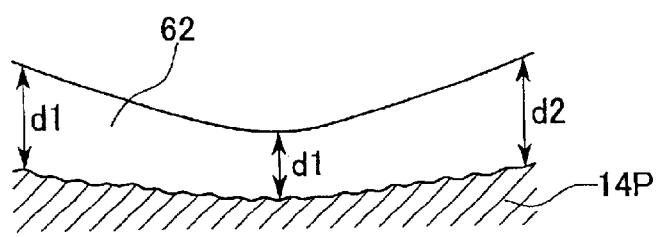
FIG. 12 is an enlarged cross sectional view showing an example of the distribution of photoresist film thickness over the wafer.

FIG. 10 shows a series of detection signals RS so obtained, where an exposure plane of a pilot wafer 14P is divided into a location (i, j) in the shot region 31(i, j), so that an, average value RS1, RS2, . . . of the reflection monitor 60 can be obtained in each shot region. As shown in FIG. 12, the surface of the wafer 14P has height differences produced by the various fabrication processes that have been applied to the pilot wafer 14P as well as non-uniform film thickness in the photoresist film 62, so that the thickness d0, d1 and d2 of the photoresist layer 62 may vary depending on the location, thereby leading to variations in reflectivity and consequently the average value RSk (k=1, 2, . . . ) of the detection signals RS. Therefore, the exposure controller 26 in FIG. 1 obtains film thickness of the photoresist layer for each shot region 31(i, j) from the average values RSk of detection signals RS.

Figure 11:
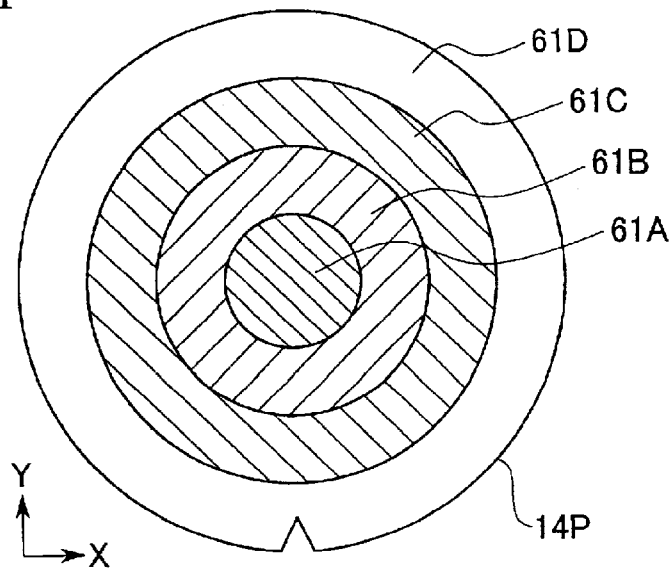
FIG. 11 is a plan view of the wafer to provide target exposure levels in roughly concentric regions.

Also, a relationship between the film thickness and optimal exposure levels (assigned exposure levels) is obtained by test printing, for example, and the results stored in the memory section 26a. This relationship is expressed as a function of illumination and processing condition (such as minimum line width in the shot region) also. The exposure controller 26 obtains assigned exposure levels for each shot region 31(i, j) according to such relationships, and divides the assigned exposure levels into four levels, for example, within allowable range. The result is a division of the exposure region of the wafer 14P into four sub-regions 61A~61D, as shown in FIG. 11, and an assigned exposure level is allocated to each of the sub-regions 61A~61D. The wafers that follow the pilot wafer 14P can be exposed with high precision according to the assigned exposure levels thus established.

The forgoing example is based on an application of the present method to the step-and-scan method of projection exposure apparatus, but the present invention can also be applied to the static exposure type apparatus.

It is obvious that various modifications of the present method and apparatus are possible without departing from the basic concept disclosed in the present invention.

As explained above, when it is desired to expose a plurality of sub-regions with different target exposure levels that are particular to each sub-region, the present exposure method based on the scanning exposure type apparatus described above prevents the reduction of the throughput without lowering the precision of exposure process control, because the procedure minimizes conventional mechanical switching of transmittance that interrupts exposure operation.

Also, the present method of exposure similarly prevents the reduction of the throughput without lowering the precision of exposure process control, when the method is applied to the static type of exposure apparatus. And, the present exposure method enables to assign target exposure levels quickly on a second object.

Therefore, by applying the present method of exposure to device production, high performance devices having superior control over the widths of circuit lines can be produced with excellent throughput. The present method of exposure can be used by the various exposure apparatuses provided in the present invention.

What is claimed is:

1. A method that exposes a second object by transferring a pattern of a first object with an exposure beam, in which a plurality of divided regions having different target exposure levels defined on said second object are successively exposed by emitting pulses of the exposure beam from a pulsed energy source and moving said first object and said second object synchronously with respect to the exposure beam, the method comprising:
setting a transmittance of a light reducing member disposed in an optical path of the exposure beam based on at least one target exposure level,
wherein the transmittance is determined so as to satisfy a predetermined condition when exposing a divided region having a minimum target exposure level;
adjusting a parameter when exposing the divided regions having different target exposure levels without changing the determined transmittance of the light reducing member.

2. A method according to claim 1, wherein said parameter includes at least one of a width of the exposure beam on the second object in the moving direction of the second object, a moving speed of the second object during the synchronous movement, an oscillation frequency of the exposure beam by the pulsed energy source, and an energy of the exposure beam emitted from the pulsed energy source.

3. A method according to claim 1, wherein said transmittance of the light reducing member is determined according to the minimum target exposure level in the plurality of exposure levels.

4. A method according to claim 1, wherein said target exposure levels are determined for the plurality of divided regions respectively, according to distances from a center of the second object.

5. A method according to claim 1, wherein said target exposure levels for the plurality of divided regions are predetermined by performing a test exposure.

6. A method according to claim 1, wherein the exposure conditions is related to the number of pulses of the exposure beam directed to the second object.

7. A method according to claim 1, wherein the second object is a wafer.

8. A method according to claim 1, further comprising forming a device pattern on a work-piece to manufacture a device.

9. An apparatus that illuminates a first object with an exposure beam and that successively exposes a plurality of divided regions defined on a second object with said exposure beam, comprising:
an illumination system having a pulsed light source that generates pulses of an other exposure beam and a light attenuator disposed in a path of the exposure beam;
a stage system having a first stage and a second stage, the first stage and the second stage being moved synchronously, and the first object disposed on the first stage and the second object disposed on the second stage;
a memory that stores target exposure levels in a plurality of different levels for a plurality of divided regions defined on the second object wherein a transmittance of the light attenuator is determined so as to satisfy a predetermined condition when exposing a divided region having a minimum exposure target level;
a control system that changes an exposure parameter when successively exposing the plurality of divided regions defined on the second object based on the target exposure levels stored in the memory without changing the determined transmittance, wherein said parameter includes oscillation frequency of the pulsed light source, target energy of each of the pulses emitted from the pulsed light source, and speed of the second stage during the synchronous movement.

10. An apparatus according to claim 9, wherein said light attenuator has a light reducing member to be provided between said pulsed light source and said second object to switch said transmittance.

11. A method according to claim 9, further comprising forming a device pattern on a work-piece to manufacture a device.

12. An exposure method in which a plurality of divided regions having different target exposure levels on a second object are successively exposed, the method comprising:
determining a transmittance of a light attenuator disposed in an optical path of an exposure beam so as to satisfy a predetermined condition when exposing a divided region having a minimum target exposure level; and exposing the plurality of divided regions having different target exposure levels on said second object without changing the transmittance of the light attenuator.

13. A method according to claim 12, the transmittance of the light attenuator is determined so that the number of exposure pulses for the divided region having the minimum target exposure level is equal to or more than the predetermined minimum number of exposure pulses.

14. A method according to claim 13, further comprising:

synchronously moving the first object and the second object to expose each of the plurality of divided regions on the second object; and changing an exposure parameter includes at least one of a width of the exposure beam on the second object in the moving direction of the second object, a moving speed of the second object during the synchronous movement, an oscillation frequency of the pulsed energy source, and an energy of the exposure beam emitted from the pulsed energy source, during the exposure for the plurality of divided regions having different target exposure levels on said second object.

15. A method according to claim 14, wherein said exposure levels are determined for the plurality of divided regions respectively, in accordance with distances from a center of the second object.

16. A method according to claim 14, wherein the second object is a wafer.

17. A method according to claim 12, further comprising forming a device pattern on the second object to manufacture a device.

18. An exposure apparatus in which a plurality of divided regions having different target exposure levels on a wafer are successively exposed, the apparatus comprising:

means for determining a transmittance of a light attenuator disposed in an optical path of an exposure beam so as to satisfy a predetermined condition when exposing a divided region having a minimum target exposure level; and means for exposing the plurality of divided regions having different target exposure levels on the wafer without changing the transmittance of the light attenuator.

19. A method according to claim 18, further comprising forming a device pattern on the wafer to manufacture a device.

* * * * *